US007924542B2

(12) United States Patent
Takahashi et al.

(10) Patent No.: US 7,924,542 B2
(45) Date of Patent: *Apr. 12, 2011

(54) POWER SUPPLY CONTROLLER AND SEMICONDUCTOR DEVICE

(75) Inventors: Seiji Takahashi, Yokkaichi (JP);
Masayuki Kato, Yokkaichi (JP);
Masahiko Furuichi, Yokkaichi (JP);
Isao Isshiki, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 679 days.

This patent is subject to a terminal disclaimer.

(21) Appl. No.: 11/920,533

(22) PCT Filed: May 25, 2006

(86) PCT No.: PCT/JP2006/310456
§ 371 (c)(1),
(2), (4) Date: Nov. 30, 2007

(87) PCT Pub. No.: WO2006/129548
PCT Pub. Date: Dec. 7, 2006

(65) Prior Publication Data
US 2009/0128106 A1 May 21, 2009

Related U.S. Application Data

(62) Division of application No. PCT/JP2006/310456, filed on May 25, 2006.

(30) Foreign Application Priority Data

Jun. 3, 2005 (JP) ................................ 2005-163967

(51) Int. Cl.
*H02H 7/00* (2006.01)
(52) U.S. Cl. ........................................................ 361/93.1
(58) Field of Classification Search .................. 361/93.1
See application file for complete search history.

(56) References Cited

U.S. PATENT DOCUMENTS 7,701,686 B2 * 4/2010 Kato et al. ................ 361/93.1

FOREIGN PATENT DOCUMENTS

| EP | 1 793 496 A2 | 6/2007 |
| JP | A 4-142468 | 5/1992 |
| JP | A 2000-235424 | 8/2000 |
| JP | A 2001-217696 | 8/2001 |
| JP | A 2003-87959 | 3/2003 |
| JP | A 2005-27380 | 1/2005 |

OTHER PUBLICATIONS

Japanese Office Action issued in Japanese Patent Application No. 2007-518937, on Feb. 25, 2010, (with English Translation).

* cited by examiner

*Primary Examiner* — Stephen W Jackson
(74) *Attorney, Agent, or Firm* — Oliff & Berridge PLC

(57) ABSTRACT

A voltage-dividing circuit 60, which is formed of serially connected voltage-dividing resistors R1, R2, R3, is disposed between the source terminal S of a power MOSFET 15 and the ground. The divided voltage Va at a connecting point A is applied to one of the input terminals of a comparator 62, while the divided voltage Vb at a connecting point B is applied to one of the input terminals of a comparator 64. The other input terminals of the comparators 62, 64 are connected to the connecting line between an external terminal P4, to which an external resistor 12 is connected, and an FET 30.

11 Claims, 5 Drawing Sheets

POWER SUPPLY CONTROLLER AND SEMICONDUCTOR DEVICE

TECHNICAL FIELD

The present invention relates to a power supply controller and a semiconductor device.

BACKGROUND ART

A power supply controller is conventionally provided, in which a high-power semiconductor switching element such as a power MOSFET is disposed on a current supply line connected between a power source and a load, and which is configured to control the power supply to the load by switching the semiconductor switching element between ON and OFF. In such a power supply controller, it is known that a self-protective function is provided for protecting its own semiconductor switching element. The self-protective function turns off the semiconductor switching element by controlling the potential of the control terminal (e.g., the gate in the case of a MOSFET) of the semiconductor switching element, when an overcurrent (i.e., an abnormal current) has occurred due to short-circuiting in the load, for example. Specifically, as shown in JP-A-2001-217696, for example, a current detecting resistor is serially connected to the load terminal (e.g., the source or drain in the case of a MOSFET) of the semiconductor switching element. The voltage drop on the resistor is detected, and an overcurrent anomaly is determined so as to shut off the semiconductor switching element if the voltage drop is higher than a predetermined level.

A current passing through the semiconductor switching element will vary along a predetermined load line, until the current is stable after start-up of the semiconductor switching element. Therefore, in the case that an overcurrent anomaly is detected based on comparison of a load current, passing through the semiconductor switching element, with a threshold, the problem arises that it may require time before detection when an overcurrent anomaly has occurred, if the threshold is set to a fixed level. For example, FIG. 5 shows the drain-to-source voltage Vds of a power MOSFET and the current Id passing therethrough. In the case that the load is in a normal state, the values of the drain-to-source voltage Vds and the current Id will ideally vary along the load line L0 starting from the point B0 resulting in settlement at the stabilization point A0, while the power MOSFET is maintained ON after the power MOSFET turns ON.

However, in case that an anomaly such as short-circuiting in the load has occurred, the source voltage of the power MOSFET will rise very little after starting from the point B0 on start-up, because the voltage drop in the load is extremely low. That is, the current Id passing through the power MOSFET will rise steeply while the drain-to-source voltage Vds of the power MOSFET varies little. If the threshold is set to a fixed level (as shown by Line L7 in the figure), the level should be determined so as to cover the entire load line. Therefore, in case that short-circuiting occurs immediately after the power MOSFET turns ON as described above, it requires considerable time before the threshold is reached as shown by the line L6. This will result in great power loss in the power MOSFET, and cause delay in protection.

Thus, there is a need in the art to provide a construction capable of detecting an overcurrent anomaly rapidly so as to achieve appropriate protection in a power supply controller having an overcurrent detecting function.

SUMMARY OF THE INVENTION

A power supply controller according to the present invention is disposed between a power source and a load, and configured to control power supply from the power source to the load. The power supply controller includes a semiconductor switching element disposed on a current supply line from the power source to the load, and a current detecting circuit configured to detect a load current passing through the semiconductor switching element. The power supply controller further includes a voltage generator circuit configured to generate a voltage according to an output-side voltage of the semiconductor switching element, and an anomaly detecting circuit configured to output an anomaly signal based on a detection signal from the current detecting circuit and a generated voltage of the voltage generator circuit, if a load current passing through the semiconductor switching element exceeds a threshold current corresponding to the generated voltage.

In the power supply controller of the present invention, the threshold current can be set so as to increase or decrease with increase or decrease of the output-side voltage (e.g., the source voltage in the case of an N-channel MOSFET, or the drain voltage in the case of a P-channel MOSFET) of the semiconductor switching element. Thereby, in case that short-circuiting occurs in the load, for example, the level of a load current will immediately reach the threshold current level, so that rapid protection can be achieved compared to a construction in which a threshold is set to a constant level.

EXPLANATION OF SYMBOLS

10 . . . Power supply controller
11 . . . Semiconductor device
12 . . . External resistor (Current-voltage converter circuit)
15 . . . Power MOSFET (Semiconductor switching element, Power FET)
16 . . . Sense MOSFET (Current detecting circuit, Sense FET)
50 . . . Load
60 . . . Voltage-dividing circuit (Voltage generator circuit)
61 . . . Power source
62, 64 . . . Comparator (Anomaly detecting circuit)
63 . . . Current supply line
66 . . . FET (Bias circuit)
68 . . . Bias resistor (Bias Circuit)
70 . . . FET (Leakage current block circuit)
Ip . . . Load current
Is . . . Sense current (Detection signal)
Ith 1, Ith2 . . . Threshold current
P4 . . . External terminal
S2 . . . High-level output signal (Anomaly signal)
S4 . . . High-level output signal (Anomaly signal)

Va, Vb . . . Divided voltage (Generated voltage)
Vo . . . Terminal voltage (Output voltage of Current-voltage converter circuit)
Vs . . . Source voltage (Output-side voltage of Semiconductor switching element)

BEST MODE FOR CARRYING OUT THE INVENTION

First Embodiment

A first embodiment according to the present invention will be explained with reference to FIGS. 1 to 3 and 5.

(1) General Construction

Figure 1:
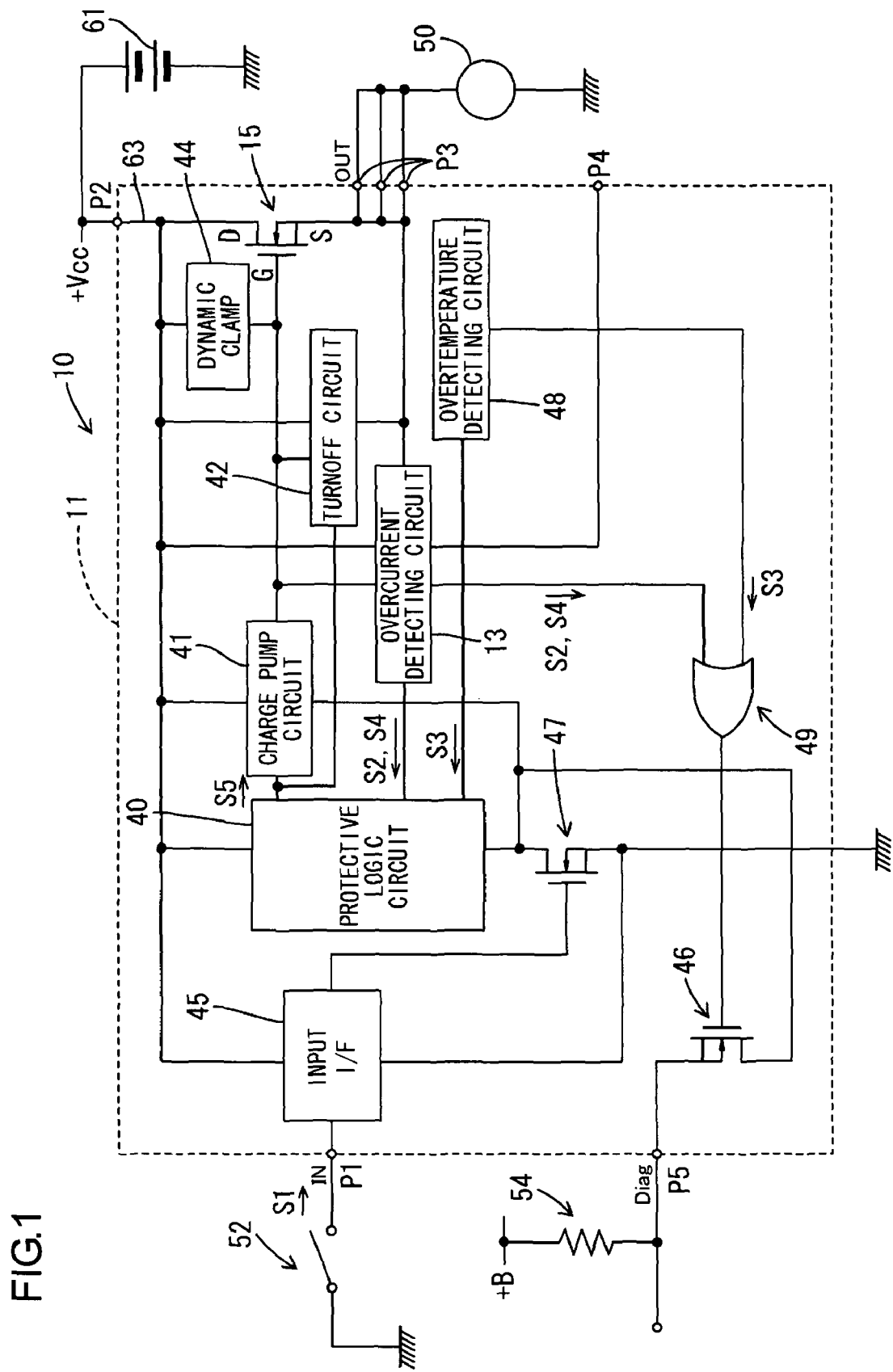
[FIG. 1] is a block diagram illustrating the general construction of a power supply controller according to a first embodiment of the present invention.

FIG. 1 is a block diagram showing the general construction of a power supply controller 10 according to the present embodiment. As shown in the figure, the power supply controller 10 of the present embodiment includes a power MOSFET 15 (i.e., an example of "a semiconductor switching element" and "a power FET" of the present invention) disposed on a current supply line 63 connected between a power source 61 (a vehicle power source) and a load 50, so as to control the power supply from the power source 61 to the load 50 by switching the power MOSFET 15 between ON and OFF. In the present embodiment, the power supply controller 10 can be installed on a vehicle not shown, and used for drive control for the load 50 such as a vehicle lamp, a cooling fan motor or a defogger heater.

As shown in FIG. 1, the power supply controller 10 is formed as a single-chip semiconductor device 11, on which an input terminal P1, a power supply (Vcc) terminal P2, an output terminal P3, an external terminal P4 and a diagnostic output terminal P5 are provided. The input terminal P1 of the semiconductor device 11 is connected to an operation switch 52. The power supply terminal P2 is connected to the power source 61, while the output terminal P3 is connected to the load 50. The external terminal P4 is connected to an external resistor 12 (i.e., an example of "a current-voltage converter circuit" of the present invention) described below.

The input terminal P1 is pulled up to the power supply voltage Vcc side when the operation switch 52 is OFF. When the operation switch 52 is turned ON, a low-level control signal S1 (a load ON signal) is inputted to an input interface 45. If the low-level control signal Si is thus inputted to the input interface 45, an FET 47 turns on so that a protective logic circuit 40 operates.

A charge pump circuit 41 and a turnoff circuit 42 are connected to the protective logic circuit 40. Further an overcurrent detecting circuit 13 and an overtemperature detecting circuit 48 are also connected thereto. A dynamic clamp 44 is connected between the drain terminal D and the gate terminal G of the power MOSFET 15. The overtemperature detecting circuit 48 detects the temperature in the vicinity of the power MOSFET 15, and determines a temperature anomaly so as to output a high-level output signal S3 if the detected temperature exceeds a predetermined threshold temperature.

Figure 2:
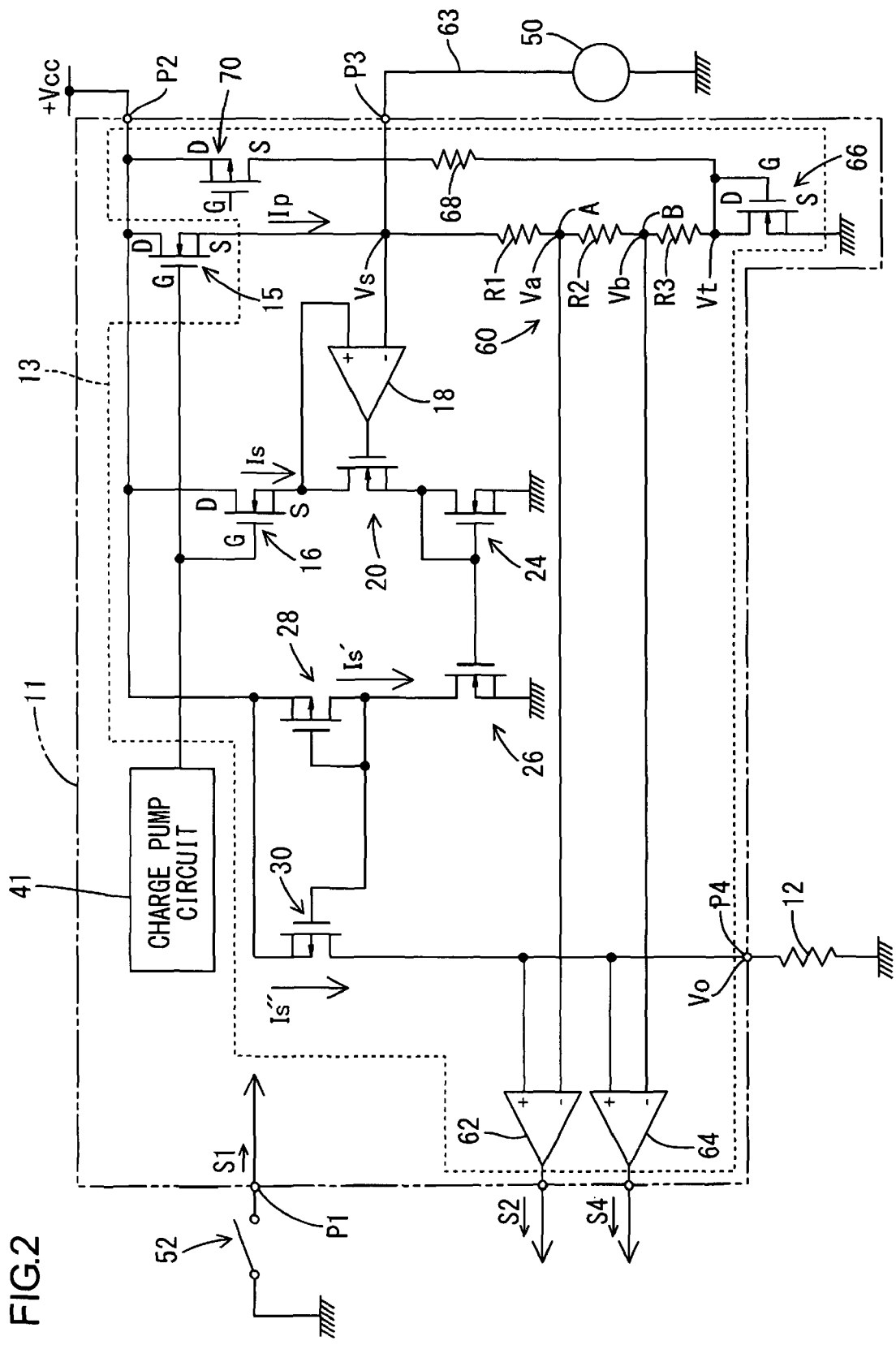
[FIG. 2] is a circuit diagram mainly illustrating the construction of an overcurrent detecting circuit (an anomaly detecting circuit) of the power supply controller shown in FIG. 1.

The output of the charge pump circuit 41 is applied to the gate terminal G of the power MOSFET 15, and also applied to the gate terminal G of a sense MOSFET 16 disposed in the overcurrent detecting circuit 13 (See FIG. 2). The turnoff circuit 42 is disposed between the drain terminal D and the source terminal S of the power MOSFET 15, and connected to the gate terminals G of the power MOSFET 15 and the sense MOSFET 16. The charge pump circuit 41 and the turnoff circuit 42 operate based on a control signal S5 from the protective logic circuit 40 as described below, so as to turn the power MOSFET 15 and the sense MOSFET 16 to a conductive state or a shutoff state.

(2) Overcurrent Detecting Circuit

Next, the overcurrent detecting circuit 13 will be explained. FIG. 2 is a circuit diagram mainly showing the overcurrent detecting circuit 13 of the power supply controller 10. As shown in the figure, the overcurrent detecting circuit 13 includes the sense MOSFET 16 (i.e., an example of "a current detecting circuit" and "a sense FET" of the present invention), through which a sense current corresponding to the current amount of the power MOSFET 15 passes. For forming the power MOSFET 15 and the sense MOSFET 16, a plurality of MOSFETs are arranged. The drain terminals D of the MOSFETs are connected in common to one another, and further connected to the power supply terminal P2. The source terminals S of most of the MOSFETs are connected in common to the output terminal P3, so that the MOSFETs form the power MOSFET 15. The source terminals S of the rest of the MOSFETs are connected in common to one another, so that the MOSFETs form the sense MOSFET 16. The ratio of the number of MOSFETs constituting the sense MOSFET 16 to the number of MOSFETs constituting the power MOSFET 15 corresponds approximately to a sense ratio k. The source terminal S of the power MOSFET 15 and the source terminal S of the sense MOSFET 16 are connected to the respective input terminals of an operational amplifier 18. The gate terminal of an FET 20 is connected to the output side of the operational amplifier 18.

Thus the potentials of the drain terminals D of the power MOSFET 15 and the sense MOSFET 16 are maintained equal to each other, and the potentials of the source terminals S thereof are also maintained equal to each other. Thereby, a sense current Is (i.e., an example of "a detection signal" of the present invention) passing through the sense MOSFET 16 can be stably maintained to a constant ratio to a load current Ip passing through the power MOSFET 15. The power MOSFET 15 and the sense MOSFET 16 can be turned to a conductive state conditionally upon a low-level control signal Si being inputted to the input terminal P1 when the operation switch 52 is turned ON.

An FET 24 and an FET 26 form a current mirror circuit, and thereby a mirror current Is' of the same level as the sense current Is of the sense MOSFET 16 passes on the connecting line between the FET 26 and an FET 28. Further the FET 28 and an FET 30 form a current mirror circuit, and thereby a mirror current Is" of the same level as the sense current Is passes through the FET 30 and the external terminal P4. (Hereinafter, the mirror currents Is' and Is" may be called simply "a sense current Is".)

A voltage-dividing circuit 60 (i.e., an example of "a voltage generator circuit" of the present invention), which is formed of a plurality of (e.g., three) serially-connected voltage-dividing resistors R1, R2, R3, is disposed between the source terminal S of the power MOSFET 15 and the ground. The divided voltage Va (i.e., an example of "a generated voltage" of the present invention) at the connecting point A between the voltage-dividing resistors R1 and R2, and the divided voltage Vb (i.e., an example of "a generated voltage" of the present invention) at the connecting point B between the voltage-dividing resistors R2 and R3 are provided by dividing the source voltage Vs (i.e., an example of "an output-side voltage of a semiconductor switching element" of the present invention) of the power MOSFET 15 by the three voltage-dividing resistors R1-R3. Therefore the levels thereof depend on the resistance ratio between the voltage-dividing resistors R1-R3, and the voltage-dividing resistors having a predetermined ratio (e.g., Resistance value of the voltage-dividing resistor R1:Resistance value of the voltage-dividing resistor R2:Resistance value of the voltage-dividing resistor R3=1:1:1) are selected beforehand.

The divided voltage Va at the connecting point A is applied to one (i.e., the negative input terminal) of the input terminals of a comparator 62 (i.e., an example of "an anomaly detecting circuit" of the present invention), while the divided voltage Vb at the connecting point B is applied to one (i.e., the negative input terminal) of the input terminals of a comparator 64 (i.e., an example of "an anomaly detecting circuit" of the present invention). The other input terminals (i.e., the positive input terminals) of both of the comparator 62, 64 are connected to the connecting line between the FET 30 and the external terminal P4, that is, connected to the external terminal P4.

An FET 66, in which diode connection (i.e., common connection between the gate terminal G and the drain terminal D) is formed, is disposed between the voltage-dividing circuit 60 and the ground (i.e., an example of "a downstream-end side of a voltage-dividing circuit" of the present invention). The gate terminal G of the FET 66 is connected to the power supply terminal P2 via a bias resistor 68 and an FET 70. When a low-level control signal S1 is inputted to the input terminal P1 (i.e., an example of "when an input signal to a semiconductor switching element is active" of the present invention), the FET 70 turns on, i.e., turns to a conductive state, so as to permit conduction between the power supply terminal P2 and the bias resistor 68. Then a constant voltage Vt (as a bias) is applied between the voltage-dividing circuit 60 and the ground because of the FET 66. Thus the FET 66 and the bias resistor 68 function as "a bias circuit" of the present invention, and the FET 70 functions as "a leakage current block circuit" of the present invention.

According to this construction, when a high-level control signal S1 is inputted to the input terminal Pi, i.e., when a load ON signal is not inputted, the FET 70 in the shutoff state prevents a leakage current passing from the power source 61 into the load 50 through the bias resistor 68 and the voltage-dividing circuit 60, or a leakage current passing from the power source 61 into the ground through the bias resistor 68 and between the drain and source of the FET 66. Thereby reduction of the charge amount of the power source 61 can be suppressed. In the present embodiment, the FETs 66, 70 and the bias resistor 68 are included in the semiconductor device 11. A ground connecting terminal not shown, to which the downstream ends of the FETs 24, 26, 47, 66 are connected in common, is provided on the semiconductor device 11.

The comparator 62 compares the terminal voltage Vo (i.e., the potential at the external terminal P4, and an example of "an output voltage of a current-voltage converter circuit" of the present invention) of the external resistor 12, which varies depending on the level of the sense current Is, with the divided voltage Va at the connecting point A. The comparator 62 outputs a high-level output signal S2 (i.e., an example of "an anomaly signal" of the present invention), when the terminal voltage Vo exceeds the divided voltage Va due to a sense current Is of high level passing to the external resistor 12. The divided voltage Va is expressed as $(2/3)\cdot(Vs-Vt)+Vt$ (where Vs is the source voltage of the power MOSFET 15). Therefore the threshold current value can be arbitrarily set by adjusting the resistance value of the external resistor 12 according to the load resistance of an external circuit (e.g., the load 50) connected to the power supply controller 10. In the present embodiment, during a short anomaly (short current), i.e., when a high current passes through the power MOSFET 15 due to short-circuiting in the load 50, for example, the level of the terminal voltage Vo exceeds the divided voltage Va so that the comparator 62 outputs a high-level output signal S2. That is, the level of a load current Ip, which passes through the power MOSFET 15 when the terminal voltage Vo reaches the divided voltage Va, corresponds to a threshold current Ith1 ($=k\cdot(Va/r)$, where k is the sense ratio and r is the resistance value of the external resistor 12) for short anomaly detection.

On the other hand, the comparator 64 compares the terminal voltage Vo of the external resistor 12 with the divided voltage Vb at the connecting point B. The comparator 64 outputs a high-level output signal S4 (i.e., an example of "an anomaly signal" of the present invention), when the terminal voltage Vo exceeds the divided voltage Vb since the sense current Is of a higher level than the rated current (i.e., a limit of use against which the design of the load (device) is guaranteed) of the load 50 passes to the external resistor 12. The divided voltage Vb is expressed as $(1/3)\cdot(Vs-Vt)+Vt$. The threshold current value can be also arbitrarily set by adjusting the resistance value of the external resistor 12 according to the load resistance of the load 50. The resistance value of the external resistor 12 should be adjusted, so that the level of the terminal voltage Vo exceeds the divided voltage Vb and thereby the comparator 64 outputs a high-level output signal S4 during an overcurrent anomaly, i.e., when a current lower than a short current but higher than the rated current passes through the power MOSFET 15 for some reasons other than the above short anomaly, for example. That is, the level of a load current Ip, which passes through the power MOSFET 15 when the terminal voltage Vo reaches the divided voltage Vb, corresponds to a threshold current Ith2 ($=k\cdot(Vb/r)$) for overcurrent anomaly detection.

(3) Protective Logic Circuit

The protective logic circuit 40 operates when a low-level control signal S1 is received, and outputs a low-level control signal S5 during a normal state so as to drive the charge pump circuit 41. The charge pump circuit 41 generates a higher voltage, which is applied between the gates and sources of the power MOSFET 15 and the sense MOSFET 16 so that the MOSFETs turn ON, i.e., turn to the conductive state. On the other hand, when a low-level output signal S2 or a low-level output signal S4 is received, i.e., when a current anomaly is detected, the protective logic circuit 40 outputs a high-level control signal S5 so as to turn off the charge pump circuit 41 and drive the turnoff circuit 42. Thereby, the charge between the gate and source of each of the power MOSFET 15 and the sense MOSFET 16 is released, i.e., the MOSFETs are shut off.

This shutoff operation may be a self-unrestorable shutoff operation, from which the conductive state will not be restored unless a control signal S1 (e.g. a load ON signal) is inputted again, or alternatively it may be a self-restorable shutoff operation, from which the power MOSFET 15 and the like are restored to the conductive state when a low-level output signal S2 or S4 is received.

The output signals S2 and S4 are also inputted to an OR circuit 49, which turns on an FET 46 when any of high-level output signals S2, S4 and a high-level output signal S3, outputted from the overtemperature detecting circuit 48 for indicating a temperature anomaly, is inputted, so that a signal for indicating an anomaly is outputted to an external circuit (e.g., a warning lamp) utilizing a pull-up resistor 54 connected to the diagnostic output terminal P5. The output signal S3 is also inputted to the protective logic circuit 40. When the output signal S3 is high level, the protective logic circuit 40 outputs a high-level control signal S5 so that the above-described self-restorable shutoff operation is performed for the power MOSFET 15 and the like.

(4) Effect of the present embodiment

Figure 3:
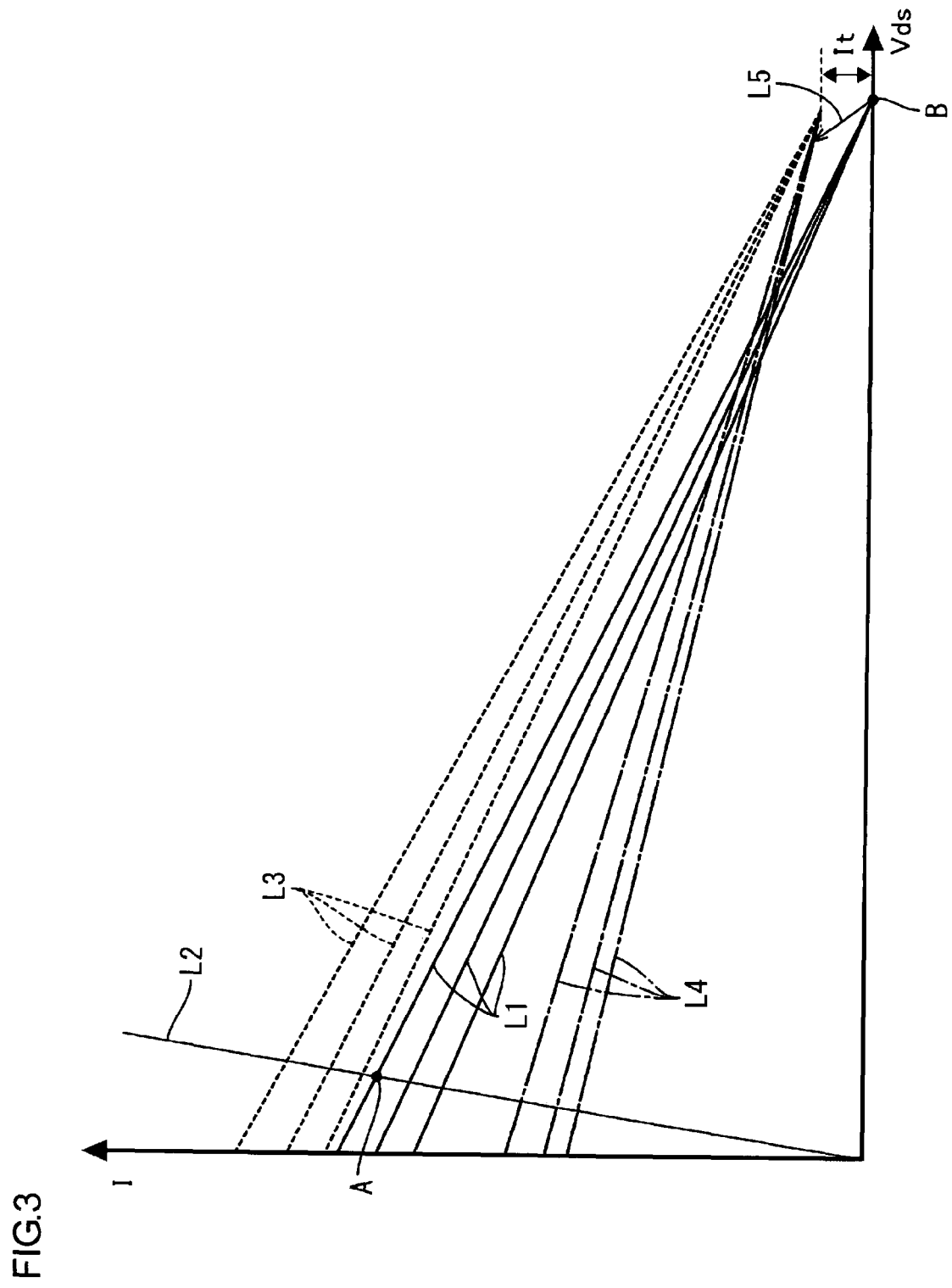
[FIG. 3] is a diagram showing the relation of threshold currents and a load current to the drain-to-source voltage of a power MOSFET.

FIG. 3 is a diagram showing the relation of the threshold currents Ith1, Ith2 and the load current Ip(=k·Is) passing through the power MOSFET 15, to the drain-to-source voltage Vds of the power MOSFET 15. The horizontal axis is a scale of the drain-to-source voltage Vds of the power MOSFET 15, while the vertical axis is a scale of the threshold currents Ith1, Ith2 and the load current Ip corresponding to the drain-to-source voltage Vds. In the figure, the lines L1 represent load lines showing the change of the load current Ip that depends on the load resistance of the load 50. The lines L2 represent On-resistance lines showing the change of the load current Ip that depends on the On-resistance of the power MOSFET 15. The sense current Is changes in proportion to the load current Ip, and therefore the following explanation points to the load current Ip as an example.

In the case that the load 50 is in a normal state, the drain-to-source voltage Vds of the power MOSFET 15 and the load current Ip will settle at the intersection A of the load line L1 with the On-resistance line L2 if the power MOSFET 15 is turned ON. That is, the values of the drain-to-source voltage Vds of the power MOSFET 15 and the load current Ip will ideally vary along the load line L1 starting from the point B (i.e., starting from a state wherein Vs (the source voltage of the power MOSFET 15)=0 and Id (the drain current of the power MOSFET 15)=0) while the power MOSFET 15 is maintained ON, and stabilize when the stabilization point (the intersection A) is reached. Three load lines L1 are shown in FIG. 3, and the area bounded by the lines corresponds to manufacturing variation of the semiconductor device 11.

However, in case that an anomaly such as short-circuiting in the load 50 has occurred, the source voltage Vs of the power MOSFET 15 will rise very little after starting from the point B on start-up, because the voltage drop in the load 50 is extremely low. That is, the load current Ip will rise steeply after starting from the point B (See Line L5 in FIG. 3), while the drain-to-source voltage of the power MOSFET 15 varies little.

Figure 5:
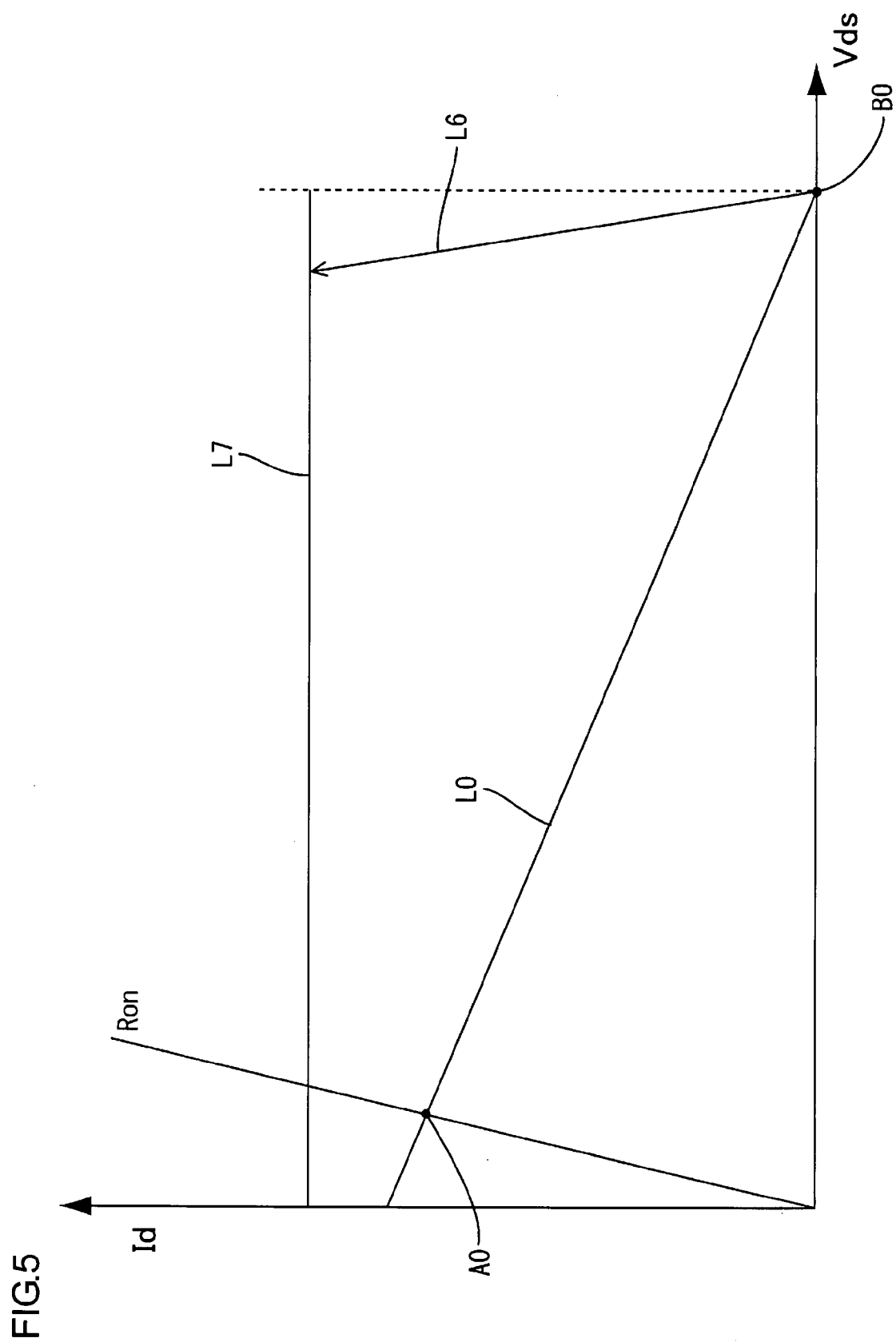
[FIG. 5] is an explanatory diagram illustrating the problem arising when a threshold is set to a constant.

If each of the threshold currents is supposedly determined so as to be a fixed level, the threshold current should be set to a higher value than the stabilization point A as shown in FIG. 5. Therefore, in the initial phase of a turn-on operation of the power MOSFET 15 wherein the source voltage Vs is low and the drain-to-source voltage Vds is high, it requires time before current anomalies are detected. In order to detect current anomalies rapidly, it is preferable that the threshold current is lower for the domain of the drain-to-source voltage Vds being higher while the threshold current is higher for the domain of the voltage Vds being lower.

For this reason, in the present embodiment, the threshold currents Ith1, Ith2 are set so as to change according to the drain-to-source voltage Vds and substantially in the same slopes as those of the load lines L1, as shown by the lines L3 and L4 in FIG. 3. Specifically, in order to achieve the threshold currents Ith1, Ith2 changing in such a manner, the divided voltages Va, Vb to be compared with the terminal voltage Vo of the external resistor 12 are generated by dividing the source voltage Vs of the power MOSFET 15 in the present embodiment, as described above. Thereby the threshold currents Ith1, Ith2 can change with the divided voltages Va, Vb, i.e., change linearly according to the drain-to-source voltage Vds of the power MOSFET 15, so as to be lower for the domain of the voltage Vds being higher and to be higher for the domain of the voltage Vds being lower.

In the phase wherein the drain-to-source voltage Vds is high while the source voltage Vs is low, the load current Ip will rise steeply when an anomaly has occurred as described above. However, the threshold currents will stably rise in this phase because of the constant voltage Vt applied due to the FET 66 and the bias resistor 68, so as to be appropriate values for the domain of the drain-to-source voltage Vds of the power MOSFET 15 being very high. Thus the threshold currents are appropriately set compared to a construction in which the threshold currents are set to constant values, and thereby shutoff can be performed rapidly with small power loss in the power MOSFET 15. "It" in FIG. 3 represents the current corresponding to the constant voltage Vt, which passes through the FET 66 when the power MOSFET 15 is OFF and the FET 66 is on.

In FIG. 3, the lines L3 show the change of the threshold current Ith1 for short anomaly detection, while the lines L4 show the change of the threshold current Ith2 for overcurrent anomaly detection. The manufacturing variation of the semiconductor device 11 is also shown. Thus the semiconductor device 11 may have variation in the resistance values of the voltage-dividing resistors R1-R3 due to manufacturing reasons. However, the voltage-dividing resistors R1-R3 are manufactured as elements on a single chip or in a package, and therefore all the resistance values thereof vary in the same direction (i.e., in the direction the resistance values decrease, or increase) so that the voltage-dividing ratio will not have variation. Consequently, anomalies can be precisely detected with immunity from variation of the resistance values of the voltage-dividing resistors R1-R3, if the external resistor 12 having an appropriate resistance value is selected according to the abnormal current levels (i.e., the current level during a short anomaly, and the current level during an overcurrent anomaly) to be detected.

Second Embodiment

Figure 4:
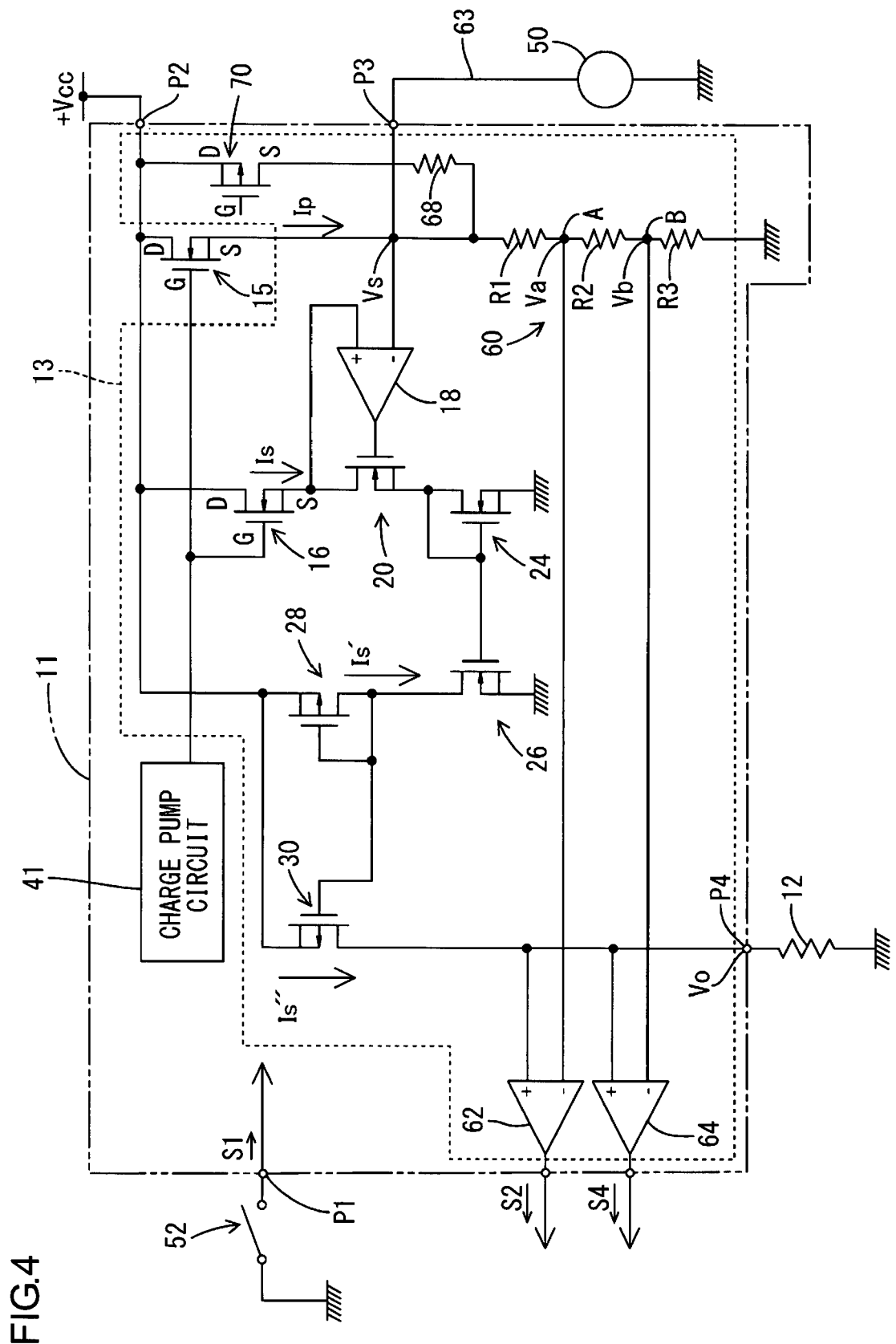
[FIG. 4] is a circuit diagram mainly illustrating the construction of an overcurrent detecting circuit (an anomaly detecting circuit) of a power supply controller according to a second embodiment.

FIG. 4 shows a second embodiment. The difference from the first embodiment is in the construction of a bias circuit. The other constructions are similar to the first embodiment, and therefore designated by the same symbols as the first embodiment. Redundant explanations are omitted, and the following explanation will be concentrated on the difference.

As shown in FIG. 4, according to the present embodiment, the bias circuit is disposed on the upstream-end side of the voltage-dividing circuit 60, i.e., between the power supply terminal P2 and the voltage-dividing circuit 60. Specifically, the downstream end of the above-described bias resistor 68 is connected to the connecting point between the source S of the power MOSFET 15 and the voltage-dividing resistor R1.

According to this construction, when a low-level control signal S1 is inputted to the input terminal P1, the FET 70 turns on, i.e., turns to a conductive state, so as to permit conduction between the power supply terminal P2 and the bias resistor 68. Thereby, a voltage corresponding to a voltage drop on the bias resistor 68 is applied between the power supply terminal P2 and the voltage-dividing resistor R1 so that the divided voltages Va, Vb are biased to the power supply voltage Vcc side. Thus the bias resistor 68 functions as "a bias circuit" of the present invention, and the FET 70 functions as "a leakage current block circuit" of the present invention. This construction has the advantage that the construction of the bias circuit is simplified in comparison with the first embodiment due to elimination of the need for the FET 66.

Other Embodiments

The present invention is not limited to the embodiments explained in the above description made with reference to the drawings. The following embodiments may be included in the technical scope of the present invention, for example, and further the present invention may be embodied in various forms without departing from the scope of the invention.

(1) In the above embodiments, the voltage-dividing circuit 60 is formed of three voltage-dividing resistors R1-R3 so that two levels of current anomalies i.e., a short anomaly and an overcurrent anomaly, can be detected. However, the present invention is not limited to this construction. One level of current anomalies may be detected using two voltage-dividing resistors, for example. Alternatively, three or more levels of current anomalies may be detected using four or more voltage-dividing resistors.

(2) In the above embodiments, the plurality of voltage-dividing resistors (i.e., the voltage-dividing resistors R1-R3) have the same resistance value. However, the present invention is not limited to this construction. The resistance values may be different from one another.

(3) In the above embodiments, each of the comparators 62, 64 as a positive logic circuit outputs a high-level output signal S2 or S4, when the terminal voltage Vo exceeds the divided voltage Va or Vb. However, obviously, a negative logic circuit that outputs a low-level output signal S2 or S4 may be used instead.

(4) In the above embodiments, the external resistor 12 is used as a current-voltage converter circuit. However the present invention is not limited to this construction, but an RC parallel circuit may be used instead. For example, the RC parallel circuit may include a first resistor element and a capacitor, which are serially connected to each other, and further include a second resistor element connected in parallel to the first resistor element and the capacitor. The RC parallel circuit has characteristics in that its conversion factor for converting the load current to a voltage is increased as time of the load current being applied advances. That is, in case that a short anomaly has occurred in the external circuit (e.g., the load of the controlled device or the like, or a wiring member), for example, or in case that a minor anomaly than that, i.e., an overcurrent anomaly wherein a current higher than the rated current of the load passes through the semiconductor switching element, has occurred, the output voltage of the RC parallel circuit will rise due to its conversion factor being increased as the current-applying time advances, and an anomaly signal is outputted when the output voltage exceeds the threshold current. The current-applying time until the anomaly signal is outputted after the occurrence of the current anomaly is shorter as the level of the abnormal current is higher, and the time is longer as the level is lower.

That is, the power supply controller operates so that an anomaly signal is immediately outputted when a high-level abnormal current has occurred in the external circuit (e.g. a wiring member (or an electric wire)) connected to the semiconductor switching element. When a relatively low-level abnormal current has occurred, an anomaly signal is outputted after a considerable time has elapsed while applying current. Thereby, burnout of the external circuit due to a high current passing thereto can be prevented. Further, the curvature of the relation between a current to be detected and a current-applying time, i.e., a time until the output voltage of the RC parallel circuit exceeds the threshold voltage, can be appropriately adjusted by changing its circuit constant (i.e., the resistance value of each resistor, and the capacitance of the capacitor). In addition, the maximum amount of a current to be detected is limited, because the current passes into the RC parallel circuit. The maximum current amount can be set to a value corresponding to the maximum allowable current of the semiconductor switching element by adjusting the resistance value of at least one of the first resistor element and the second resistor element. Moreover, the convergence of the current to be detected, in the case that an overcurrent state continues for a long time, can be adjusted by changing the resistance value of the second resistor element. The time convergence of the curvature of the relation between the current to be detected and the current-applying time can be adjusted by changing the values of the first and second resistor elements and the capacitor.

(5) In the above embodiments, the power MOSFET 15 is included as a semiconductor switching element. However the present invention is not limited to this construction. A unipolar transistor other than the above, or alternatively a bipolar transistor may be included.

(6) In the above embodiments, the sense MOSFET 16 is used as a current detecting circuit. That is, current detection is achieved by a sensing method. However the present invention is not limited to this construction, but the current detection may be achieved by a shunt method. That is, a shunt resistor may be provided on the current supply line, for example, and the load current may be detected based on the voltage drop thereon.

(7) In the above embodiments, the voltage-dividing circuit 60 is used as a voltage generator circuit. However the present invention is not limited to this construction. What is required is that voltages can be outputted according to the output-side voltage of the semiconductor switching element. For example, switching elements, through which currents corresponding to the output-side voltage of the semiconductor switching element can pass by applying the output-side voltage of the semiconductor switching element to the control terminal thereof, and resistors, through which the currents from the switching elements pass, may be included. The terminal voltages of the resistors can be provided as generated voltages.

(8) In the above embodiment, the FET and the resistor are used as a bias circuit. However the present invention is not limited to this construction. For example, a constant-voltage element such as a Zener or constant-voltage diode may be provided on the current path for the voltage-dividing circuit 60. The terminal voltage of the constant-voltage element can be applied as a bias voltage.

The invention claimed is:

1. A power supply controller disposed between a power source and a load, and configured to control power supply from said power source to said load, said power supply controller comprising:
   a semiconductor switching element disposed on a current supply line from said power source to said load;
   a current detecting circuit configured to detect a load current passing through said semiconductor switching element;
   a voltage generator circuit configured to generate a voltage according to an output-side voltage of said semiconductor switching element; and
   an anomaly detecting circuit configured to output an anomaly signal based on a detection signal from said current detecting circuit and a generated voltage of said voltage generator circuit, if a load current passing through said semiconductor switching element exceeds a threshold current corresponding to said generated voltage.

2. A power supply controller as in claim 1, wherein said voltage generator circuit includes a voltage-dividing circuit configured to divide an output-side voltage of said semiconductor switching element so that a divided voltage is provided as said generated voltage.

3. A power supply controller as in claim 2;
wherein said semiconductor switching element is a power FET, and said current detecting circuit includes a sense FET through which a sense current having a predetermined relation to a load current passing through said power FET passes, said power supply controller further comprising:
a current-voltage converter circuit configured to convert a sense current passing through said sense FET to a voltage;
wherein said anomaly detecting circuit is configured to output said anomaly signal if an output voltage of said current-voltage converter circuit exceeds said generated voltage.

4. A power supply controller as in claim 3, wherein:
said power FET, said sense FET and said anomaly detecting circuit are formed as a semiconductor device configured onto a signal chip or a plurality of chips housed in a package;
said voltage-dividing circuit is included in said semiconductor device; and
said current-voltage converter circuit includes an external resistor disposed outside of said semiconductor device.

5. A power supply controller as in claim 4, wherein:
said voltage-dividing circuit is configured to generate a plurality of divided voltages; and
said anomaly detecting circuit is configured to output a plurality of anomaly signals depending on a level of an abnormal current by comparing an output voltage of said current-voltage converter circuit to said plurality of divided voltages.

6. A power supply controller as in claim 2, wherein a bias circuit is provided on an upstream-end side or a downstream-end side of said voltage-dividing circuit.

7. A power supply controller as in claim 6, wherein said bias circuit includes an FET, in which diode connection is formed, on the downstream-end side of said voltage-dividing circuit, and further includes a bias resistor connected between a gate of said FET and said power source.

8. A power supply controller as in claim 6, wherein said bias circuit includes a bias resistor connected between said power source and the upstream end of said voltage-dividing circuit.

9. A power supply controller as in claim 7, wherein a leakage current block circuit is provided on a current path for a current passing to said bias resistor, and configured to normally shut off said current and permit said current to pass when an input signal to said semiconductor switching element is active.

10. A power supply controller as in claim 8, wherein a leakage current block circuit is provided on a current path for a current passing to said bias resistor, and configured to normally shut off said current and permit said current to pass when an input signal to said semiconductor switching element is active.

11. A semiconductor device configured to control power supply using a power FET, wherein:
said power FET, a sense FET through which a sense current corresponding to a current amount of said power FET passes, an anomaly detecting circuit configured to detect an anomaly of a current passing through said power FET based on a level of said sense current, and a voltage-dividing circuit configured to divide a source voltage of said power FET are provided as a single chip or a plurality of chips housed in a package;
an external terminal, to which a current path of said sense current is connected and an external resistor is externally connectable, is provided, and said sense current passes to said external resistor through said external terminal; and
said anomaly detecting circuit is configured to output an anomaly signal based on comparison of a terminal voltage of said external resistor with a divided voltage from said voltage-dividing circuit.

* * * * *